(12) United States Patent
Kimura et al.

(10) Patent No.: US 8,316,519 B2
(45) Date of Patent: Nov. 27, 2012

(54) METHOD OF MANUFACTURING A PIEZOELECTRIC ELEMENT

(75) Inventors: Masahiko Kimura, Kusatsu (JP); Kosuke Shiratsuyu, Omihachiman (JP); Toshikazu Takeda, Omihachiman (JP); Nobuyuki Wada, Yasu (JP)

(73) Assignee: Murata Manufacturing Co., Ltd., Nagaokakyo-Shi (JP)

( * ) Notice: Subject to any disclaimer, the term of this patent is extended or adjusted under 35 U.S.C. 154(b) by 158 days.

(21) Appl. No.: 12/633,907

(22) Filed: Dec. 9, 2009

(65) Prior Publication Data
US 2010/0083474 A1 Apr. 8, 2010

Related U.S. Application Data

(60) Division of application No. 11/856,914, filed on Sep. 18, 2007, now abandoned, which is a continuation of application No. PCT/JP2005/023247, filed on Dec. 19, 2005.

(30) Foreign Application Priority Data

Mar. 24, 2005 (JP) .................. 2005-086102

(51) Int. Cl.
*H04R 17/10* (2006.01)
*H05K 3/12* (2006.01)
(52) U.S. Cl. ......... 29/25.35; 29/851; 310/358; 310/363; 310/365; 252/62.9 PZ

(58) Field of Classification Search .................. 29/25.35, 29/830, 851, 846; 310/358, 363, 365; 252/62.9 PZ
See application file for complete search history.

(56) References Cited

U.S. PATENT DOCUMENTS

| 5,233,260 A * | 8/1993 | Harada et al. ............. 310/363 X |
| 5,892,318 A * | 4/1999 | Dai et al. ...................... 310/358 |
| 6,773,621 B2 * | 8/2004 | Hammer et al. .......... 310/365 X |
| 2003/0222240 A1 * | 12/2003 | Sasaki et al. ........... 252/62.9 PZ |

FOREIGN PATENT DOCUMENTS

| JP | 48-081096 A | 10/1973 | |
| JP | 49-056198 | 5/1974 | |
| JP | 49-100600 | 9/1974 | |
| JP | 63132491 A * | 6/1988 | ................ 29/25.35 |
| JP | 2004-274030 | 9/2004 | |
| JP | 2005-72370 | 3/2005 | |
| JP | 2006-108652 | 4/2006 | |

OTHER PUBLICATIONS

PCT/JP2005/023247 Written Opinion dated Feb. 21, 2006.

* cited by examiner

*Primary Examiner* — A. Dexter Tugbang
(74) *Attorney, Agent, or Firm* — Dickstein Shapiro LLP

(57) ABSTRACT

A method for manufacturing a piezoelectric element that includes a piezoelectric ceramic body containing an internal electrode. The piezoelectric ceramic body is mainly made of a perovskite complex oxide containing an alkali metal niobate-based compound containing at least one element selected from among K, Li, and Na. The internal electrode is made of a base metal material, such as Ni or Cu. The piezoelectric element is produced by co-sintering the internal electrode and the piezoelectric ceramic body in a reducing atmosphere.

4 Claims, 2 Drawing Sheets

METHOD OF MANUFACTURING A PIEZOELECTRIC ELEMENT

CROSS REFERENCE TO RELATED APPLICATIONS

The present application is a divisional of application Ser. No. 11/856,914, filed Sep. 18, 2007, which is a continuation of International Application No. PCT/JP2005/023247, filed Dec. 19, 2005, and claims priority to Japanese Patent Application No. JP2005-086102, filed Mar. 24, 2005, the entire contents of each of these applications being incorporated herein by reference in their entirety.

FIELD OF THE INVENTION

The present invention relates to piezoelectric elements, and more specifically to a monolithic piezoelectric element including a piezoelectric ceramic body containing an internal electrode and a method for manufacturing the piezoelectric element.

BACKGROUND OF THE INVENTION

A variety of piezoelectric elements are increasingly used in electronic apparatuses as the electronic technology is being developed. Among such piezoelectric elements, monolithic piezoelectric elements are manufactured as below.

First, a piezoelectric ceramic raw material is prepared by a known solid-phase synthesis, and ceramic green sheets are formed by a known sheet forming technique. Then, an electroconductive pattern is formed by applying an electroconductive paste on the surface of some of the ceramic green sheets. Subsequently, the ceramic green sheet having the electroconductive pattern is disposed between the ceramic green sheets not having electroconductive patterns, followed by pressing to yield a ceramic stack. Then, the ceramic stack is fired so that the ceramic green sheets and the electroconductive paste are co-sintered to form a piezoelectric ceramic body containing the internal electrode. The piezoelectric ceramic body is provided with external electrodes to complete a monolithic piezoelectric element.

Electroconductive materials for forming the internal electrodes include noble metals, such as Pt and Pd, and base metals, such as Ni or Cu. It is desirable to use relatively inexpensive base metals from the viewpoint of material cost.

Unfortunately, in order to sinter the ceramic stack, it needs to be fired at a high temperature (for example, 1000 to 1400° C.). If the internal electrodes are formed of a base metal and the firing is performed in a normal atmosphere, the base metal may be oxidized to lose electroconductivity. Hence, the use of base metals as the electroconductive material involves performing firing in a reducing atmosphere.

The piezoelectric ceramic composition for forming the ceramic green sheets generally contains oxides. If the piezoelectric ceramic composition is exposed to a reducing atmosphere, it may turn into a semiconductor, and consequently the piezoelectric element can lose its function.

Accordingly, a piezoelectric element has been proposed which uses a piezoelectric material more resistant to reduction so that a base metal, such as Ni or Cu, is used as the material of the internal electrodes (Patent Document 1).

In Patent Document 1, the piezoelectric ceramic composition is prepared from a lead zirconate titanate ($PbTiO_3$—$PbZrO_3$, hereinafter referred to as PZT) compound, which is a perovskite complex oxide (general formula: $ABO_3$), and the resistance to reduction of the piezoelectric ceramic composition is enhanced by setting the A site component content a higher than that of the stoichiometric composition and adding Ca in the A site. Patent Document 1 intends to produce a desired piezoelectric element by giving a reduction resistance to the piezoelectric ceramic composition so that the piezoelectric ceramic composition and a base metal can be fired together in a reducing atmosphere.

Other techniques using PZT compounds as the piezoelectric ceramic composition have also been proposed. For example, a monolithic electrostrictive element has been proposed which mainly uses a Ni-containing metal for the internal electrode and a PZT compound for the electrostrictive element. In the PZT compound of this electrostrictive element, Sr, Ba, or Ca is partially substituted for Pb (Patent Document 2).

In Patent Document 2, Sr, Ba, or Ca is substituted for part of the Pb of a PZT compound (piezoelectric ceramic composition) at a percentage of 20 at % or more so that the piezoelectric ceramic composition turns resistant to reduction. Consequently, the piezoelectric ceramic composition can be prevented from being reduced even if it is exposed to a reducing atmosphere. Patent Document 2 thus intends to produce a desired piezoelectric element by firing a piezoelectric ceramic composition and a base metal together in a reducing atmosphere as disclosed in Patent Document 1.

Alkali metal niobates, such as $KNbO_3$—$NaNbO_3$, have been known as piezoelectric ceramic compositions other than PZT compounds. For example, there have been proposed a piezoelectric ceramic prepared by adding $Li_2O$ to $KNbO_3$—$NaNbO_3$ (Patent Document 3), a piezoelectric ceramic prepared by adding MnO to $KNbO_3$—$NaNbO_3$ (Patent Document 4), and a piezoelectric ceramic prepared by adding $Fe_2O_3$ or $CO_2O_3$ to $KNbO_3$—$NaNbO_3$ (Patent Document 5).

Patent Document 1: Japanese Unexamined Patent Application Publication No. 2-138781
Patent Document 2: Japanese Unexamined Patent Application Publication No. 2-224283
Patent Document 3: Japanese Unexamined Patent Application Publication No. 48-81096
Patent Document 4: Japanese Unexamined Patent Application Publication No. 49-56198
Patent Document 5: Japanese Unexamined Patent Application Publication No. 49-100600

SUMMARY OF THE INVENTION

Although Patent Documents 1 and 2 give a reduction resistance to the piezoelectric ceramic compositions, or the PZT compounds, by substituting Ca or the like for part of the Pb of the A site, the inventors of the present invention have found from the results of experiments that the compositions capable of giving a reduction resistance are extremely limited. This is because the standard free energy of formation of lead oxide that is a main constituent of PZT compounds is increased to more than that of base metal oxides at high temperatures of 1000° C. or more, at which firing is generally performed. Even if part of the Pb of the A site is replaced with Ca or the like, the PZT compounds can be reduced by firing in a reducing atmosphere at a high probability. It is difficult to universally give a reduction resistance to PZT compounds, and besides they can be reduced by firing in a reducing atmosphere at high probability. Accordingly, the piezoelectric properties may be degraded or the resulting piezoelectric element may lose its function.

Although Patent Documents 3 to 5 use alkali metal niobate-based piezoelectric ceramic compositions, they provide structures including an alkali metal niobate piezoelectric ceramic prepared by firing the composition in a normal atmosphere and an Ag electrode subsequently formed on the surface of the piezoelectric ceramic. These documents do not mention monolithic piezoelectric elements.

Accordingly, an object of the invention is to provide an inexpensive monolithic piezoelectric element having such a piezoelectric property as it can be properly used in practice even though it has been fired in a reducing atmosphere.

The present inventors have conducted intensive research to accomplish the object, focusing on alkali metal niobate-based compounds, and have found that alkali metal niobate-based compounds are not reduced and can maintain their piezoelectric property even by being fired in reducing atmospheres. Furthermore, the inventors have found through their subsequent intensive research that the piezoelectric property can be maintained even by firing a base metal for the internal electrode and a piezoelectric ceramic composition together in a reducing atmosphere.

The present invention has been made on the basis of the above technical findings. A piezoelectric element according to the present invention includes a piezoelectric ceramic body and an internal electrode buried in the piezoelectric ceramic body. The piezoelectric ceramic body is mainly made of a perovskite complex oxide containing an alkali metal niobate-based compound. The internal electrode is made of a base metal material. The piezoelectric element is produced by co-sintering the internal electrode and the piezoelectric ceramic body.

The alkali metal niobate-based compound may contain at least one element selected from the group consisting of K, Li, and Na, and the base metal material may mainly contain Ni.

The present invention also provides a method for manufacturing a piezoelectric element including a piezoelectric ceramic body and an internal electrode buried in the piezoelectric ceramic body. The method includes the step of: preparing a piezoelectric ceramic material mainly containing a perovskite complex oxide containing an alkali metal niobate-based compound and forming the piezoelectric ceramic material into compacts having a predetermined shape; the step of applying an electroconductive paste for forming the internal electrode onto the compacts; the step of stacking the compacts onto which the electroconductive paste has been applied to form a multilayer structure; and the step of co-sintering the multilayer structure in a reducing atmosphere.

The above-disclosed piezoelectric element includes a piezoelectric ceramic body containing an internal electrode. The piezoelectric ceramic body mainly contains a perovskite complex oxide containing an alkali metal niobate-based compound, and the internal electrode is made of a base metal material. Thus the internal electrode and the piezoelectric ceramic body are co-sintered. Consequently, an inexpensive monolithic piezoelectric element, such as a piezoelectric resonator, can be achieved which has such a piezoelectric property as the resonator can be properly used in practice.

The method according to the present invention produces a piezoelectric element including a piezoelectric ceramic body containing an internal electrode. The method includes the step of preparing a piezoelectric ceramic material mainly containing a perovskite complex oxide containing an alkali metal niobate-based compound and forming the piezoelectric ceramic material into compacts having a predetermined shape, the step of applying an electroconductive paste for forming the internal electrode onto the compacts, the step of stacking the compacts onto which the electroconductive paste has been applied to form a multilayer structure, and the step of co-sintering the multilayer structure in a reducing atmosphere. Thus, this method facilitates the formation of a desired piezoelectric ceramic body containing an internal electrode co-sintered in a reducing atmosphere, and easily provides a monolithic piezoelectric element capable of being used in practice.

REFERENCE NUMERALS

1: piezoelectric ceramic body
2: internal electrode

DETAILED DESCRIPTION OF THE INVENTION

Embodiments of the invention will now be described.

Figure 1:
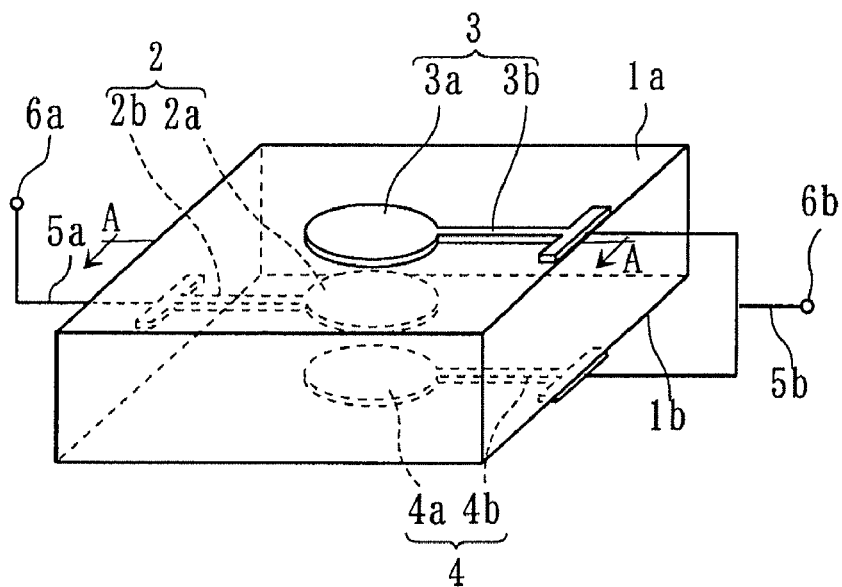
FIG. 1 is a perspective view of a piezoelectric resonator acting as a piezoelectric ceramic electronic component according to an embodiment of the present invention.
Figure 2:
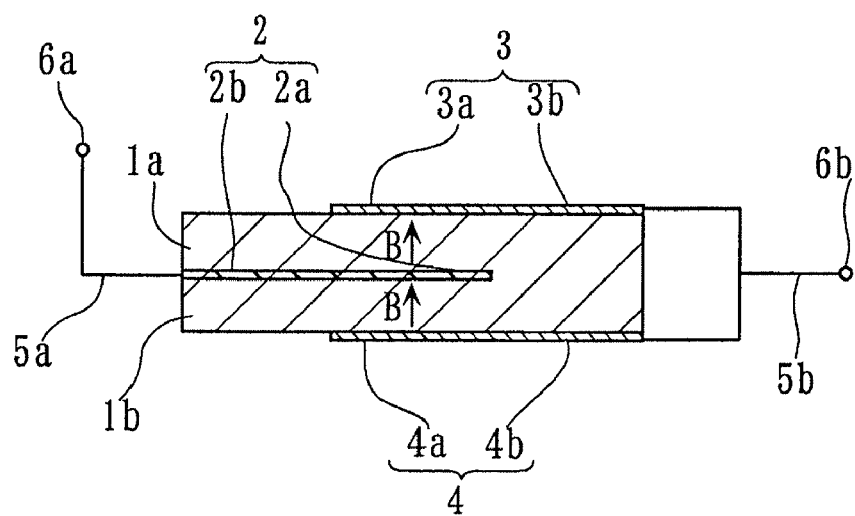
FIG. 2 is a sectional view taken along line A-A of FIG. 1.

FIG. 1 is a perspective view of a piezoelectric resonator acting as the piezoelectric element according to an embodiment, and FIG. 2 is a sectional view taken along line A-A of FIG. 1.

The piezoelectric resonator includes a piezoelectric ceramic body 1 polarized in the direction indicated by arrow B, an internal electrode 2 buried in the ceramic body 1, and external electrodes 3 and 4 formed on the outer surfaces of the piezoelectric ceramic body 1.

The internal electrode 2 has a circular vibrating portion 2a in substantially the center of the ceramic body and a T-shaped lead portion 2b extending from an end of the vibrating portion 2a and exposed at one of the side surfaces of the piezoelectric resonator.

The external electrodes 3 and 4 are disposed on the outer surfaces of the piezoelectric ceramic body 1 so as to oppose each other with the piezoelectric ceramic body 1 therebetween, respectively including T-shaped circular vibrating portions 3a and 4a in the centers of the outer surfaces and lead portions 3b and 4b extending from ends of the vibrating portions 3a and 4a. The lead portions 3b and 4b are exposed at the other side surface of the piezoelectric resonator.

The lead portion 2b is connected to an external terminal 6a through a lead wire 5a, and the lead portions 3b and 4b are connected to the other external terminal 6b through the other lead wire 5b.

The piezoelectric ceramic body 1 is made of an alkali metal niobate-based compound mainly containing a perovskite complex oxide (general formula: $ABO_3$). More specifically, the alkali metal niobate-based compound contains $KNbO_3$, $(K, Na)NbO_3$, $(Li, K, Na)NbO_3$, or the like whose alkali metal, such as Li, K, or Na, has formed a solid solution at the A site of the perovskite structure.

The internal electrode 2 is made of a relatively inexpensive base metal material, such as Ni or Cu. The internal electrode 2 and the piezoelectric ceramic body 1 are formed by being co-sintered in a reducing atmosphere. The reducing atmosphere mentioned herein refers to an atmosphere in which the oxygen partial pressure is lower than the equilibrium oxygen partial pressure produced by an equilibrium reaction between the base metal element and the base metal oxide.

As described hereinabove, the piezoelectric ceramic component including the ceramic composition of Pb-based PZT compound and the internal electrode made of base metal must be fired in a reducing atmosphere in order to prevent the base metal material from being oxidized. However, the standard free energy of formation of lead oxide being the main constituent of the PZT compound considerably increases to that of base metal oxides, such as Ni, in the range of high temperatures (1100 to 1400° C.) at which piezoelectric ceramic materials are sintered. Consequently, the PZT compound may be reduced to a semiconductor, thus losing its piezoelectric function.

According to the research of the present inventors, it has been found that a piezoelectric ceramic composition containing an alkali metal niobate-based compound having a perovskite structure is not reduced to the extent that the characteristics are degraded to cause a problem, even if it is co-sintered together with a base metal material for the internal electrode, such as Ni or Cu. Thus, a piezoelectric element can be achieved which has such a piezoelectric property as the element can be properly used in practice.

The reason why such an alkali metal niobate-based compound has reduction resistance is probably explained as below.

The standard free energies of formation of alkali metal oxide compounds, such as potassium oxide and sodium oxide, which are ceramic raw materials of the alkali metal niobate-based compounds, at temperatures of about 1100 to 1400° C. are substantially the same as those of base metal oxides such as nickel oxide and copper oxide. However, alkali metal niobate compounds synthesized with an alkali metal oxide and niobium oxide have lower standard free energies of formation than simple alkali metal oxides. It is thus presumed that alkali metal niobate-based compounds can exhibit much higher reduction resistance.

It can be assumed that when a base metal material for the internal electrode, such as Ni, is fired together with the piezoelectric ceramic material, the base metal material is diffused in the piezoelectric material and consequently gives a favorable effect to the reduction resistance of the piezoelectric ceramic material.

Since a reduction resistance is thus given to an alkali metal niobate-based compound, the alkali metal niobate-based compound and a base metal material can be co-sintered in a reducing atmosphere. Thus, the piezoelectric ceramic composition, or the alkali metal niobate-based compound, is prevented from turning into semiconductor, or the base metal material is prevented from oxidizing. Consequently, the resulting piezoelectric element exhibits such a piezoelectric property as it can be properly used in practice.

Figure 3:
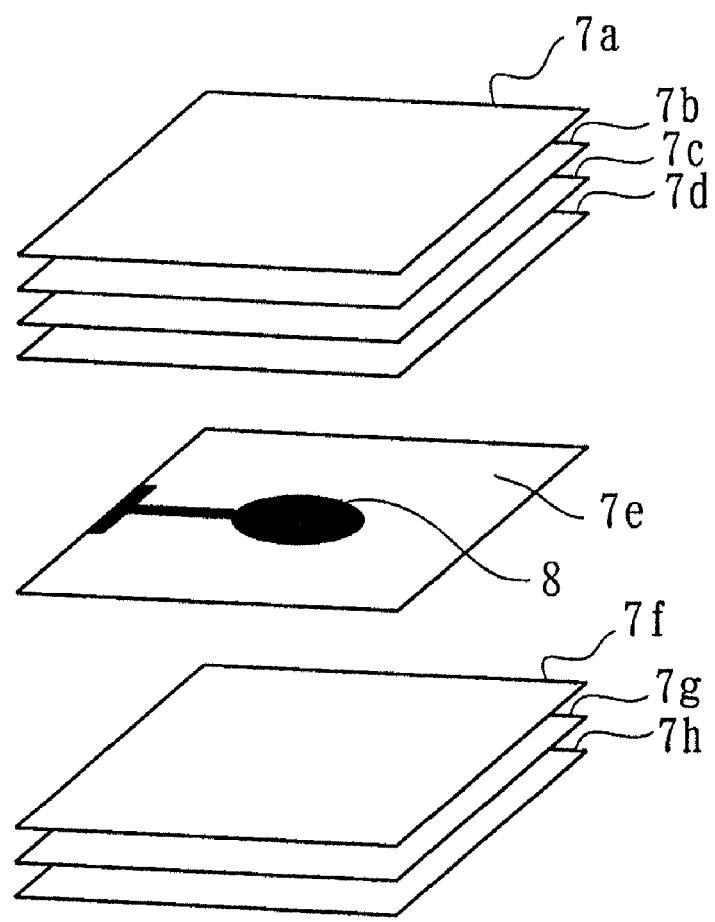
FIG. 3 is a perspective view of an example of a method for manufacturing the piezoelectric resonator.

A method for manufacturing the piezoelectric resonator will now be described with reference to FIG. 3.

First, an alkali metal compound containing, an alkali metal such as Li, K, or Na, and a Nb compound containing Nb are prepared as ceramic raw materials.

Then, those compounds are weighed out so as to yield an alkali metal niobate-based compound having a predetermined composition. The compounds weighed out are placed into a ball mill containing a pulverizing medium, such as PSZ (partially stabilized zirconia), and sufficiently mixed using pure water or ethanol as a solvent. After being dried, the material is calcined at a temperature of 700 to 900° C.

The calcined material, a solvent, such as pure water or ethanol, a binder, such as vinyl acetate resin, and a plasticizer are placed in a ball mill containing pulverizing medium, and mixed and pulverized in the ball mill to prepare a ceramic slurry. The ceramic slurry is formed into sheets by a sheet forming method, such as the doctor blade method, followed by cutting to a predetermined size. Thus, a plurality of ceramic green sheets $7a$ to $7h$ with a predetermined thickness are prepared, as shown in FIG. 3.

Then, an electroconductive paste is prepared according to the following procedure.

An organic binder and a solvent are mixed in a ratio of, for example, 1:9 to prepared an organic vehicle. Examples of the organic binder include ethyl cellulose resin, acrylic resin, and butyral resin. Examples of the solvent include α-terpineol, tetralin, and butylcarbitol. Then, a base metal material, such as Ni or Cu, is prepared, and dispersed in the organic vehicle in an organic vehicle-to-base metal material ratio of 30:70 in a three-roll mill. Thus, an electroconductive paste is completed.

Then, the electroconductive paste is applied onto one ceramic green sheet $7e$ by screen-printed to form an electroconductive pattern 8 having a predetermined shape including a circular portion in substantially the center of the surface. The ceramic green sheet $7e$ having the electroconductive pattern is sandwiched between a set of the ceramic green sheets $7a$ to $7d$ and a set of the ceramic green sheets $7f$ to $7h$ so as to be disposed in the middle of the stack, and pressed to form a ceramic stack.

The resulting ceramic stack is fired at a temperature of 1000 to 1400° C. in a predetermined reducing atmosphere. Thus, the ceramic green sheets $7a$ to $7h$ and the electroconductive pattern 8 are co-sintered to prepare a piezoelectric ceramic body (piezoelectric ceramic composition) 1 containing the internal electrode 2.

Then, electroconductive layers are formed of, for example, Ag on the front and rear surfaces of the piezoelectric ceramic 1 by sputtering or the like. The piezoelectric ceramic 1 is then polarized in the thickness direction of the piezoelectric ceramic 1 by applying a predetermined voltage at a predetermined temperature for a predetermined period of time.

After removing the electroconductive layers by etching, external electrodes 3 and 4 are formed of, for example, Ag on the front and rear surfaces of the piezoelectric ceramic 1 again by sputtering or the like in such a manner that the external electrodes oppose the internal electrode 2 and that the lead portions $3b$ and $4b$ extend in the opposite direction to the lead portion $2b$ of the internal electrode $2b$. Thus, a piezoelectric resonator is completed (see FIGS. 1 and 2).

Since the piezoelectric ceramic body 1 is reduction-resistant, it is not turned into a semiconductor even by co-sintering the ceramic green sheets $7a$ to $7h$ made of an alkali metal niobate-based compound and the electroconductive pattern made of a base metal material, such as Ni or Cu, in a reducing atmosphere. Accordingly, the resulting piezoelectric resonator can have a favorable piezoelectric property exhibiting such an electromechanical coupling coefficient k as the resonator can be properly used in practice.

The present invention is not limited to the above-described embodiment. For example, a plurality of alkali metals may from a solid solution at the A site of the alkali metal niobate-based compound, and even in this case, the compounding ratio of the alkali metals is not particularly limited.

The alkali metals constituting the A site may be partially replaced with other metals, such as Ag, Mg, Ca, Sr, Ba, Y, Nd, and La. The Nb constituting the B site may also be partially replaced with other metals, such as Ta, Ti, Sb, Sn, In, Sc, and Hf. Another element, such as Mn, Fe, Cu, Ni, Zn, Dy, Ce, Co, Si, or Al, may be further added as required.

Although the piezoelectric ceramic body 1 of the embodiment is formed by a so-called sheet forming method, any method may be applied as long as the ceramic layers and the electroconductive patterns can be co-sintered. For example, after mixing and calcining starting materials, organic materials, such as a binder, are added to the mixture. The resulting mixture is placed to a die and is formed into two piezoelectric green ceramic bodies by press forming performed by pressing in a single axis direction. One of the piezoelectric green ceramic bodies is provided with an electroconductive pattern on the surface, and the two piezoelectric green ceramic bodies are stacked to form a ceramic stack in such a manner that the electroconductive pattern lies between the piezoelectric green ceramic bodies, followed by firing.

Although in the above-describe embodiment, the external electrodes are made of Ag, a base metal material, such as Ni or Cu, may be used. In this instance, ceramic green sheets each having an electroconductive pattern may be disposed on both the front surface and the rear surface of the stack of the ceramic green sheets $7a$ to $7h$ in such a manner that those electroconductive patterns oppose the electroconductive pattern formed on the ceramic green sheet $7e$ with the lead portions extending to an end of the stack in the opposite direction to the lead portion on the ceramic green sheet $7e$. The thus formed stack is pressed and co-sintered.

Although in the above-describe embodiment, the external electrodes 3 and 4 are formed by sputtering, they may be formed by printing. For printing, for example, an electroconductive paste mainly containing Ag or the like is applied onto the front and rear surfaces of the piezoelectric ceramic 1 by printing and subsequently dried, thus forming electroconductive layers. The piezoelectric ceramic 1 is polarized in the thickness direction by applying a predetermined voltage at a predetermined temperature for a predetermined period of time, and then portions intended for the external electrodes 3 and 4 of the electroconductive layers are masked and the other portions exposed are removed by a solvent. The external electrodes 3 and 4 may be thus formed on the front and rear surfaces of the piezoelectric ceramic body 1.

Although the above embodiment has described a piezoelectric resonator as an example of the piezoelectric element, the same applies to piezoelectric actuators, piezoelectric filters, piezoelectric buzzers, and piezoelectric sensors.

Examples of the present invention will now be described in detail.

EXAMPLES

Preparation of Samples

Example 1

$K_2CO_3$, $Na_2CO_3$, and $Nb_2O_5$ were prepared as ceramic raw materials and were weighed out so as to prepare a piezoelectric ceramic composition whose main constituent was expressed by a compositional formula $(K_{0.5}Na_{0.5})NbO_3$.

Then, the weighed material was placed together with ethanol in a ball mill containing PSZ and was wet-mixed for about 4 hours. After being dried, the mixture was calcined at a temperature of 700 to 900° C. to yield a calcined material.

Then, 100 parts by weight of the calcined material, 10 parts by weight of vinyl acetate resin as a binder, and 100 parts by weight of water were placed in a ball mill containing PSZ, and a an appropriate amount of plasticizer was further added. The materials were wet-mixed for 4 hours and thus a ceramic slurry was prepared.

The ceramic slurry was formed into a compact by a doctor blade method. The compact was cut into a plurality of ceramic green sheets of 10 mm in length, 10 mm in width, and 50 μm in thickness.

Ni powder having an average particle size of 1 μm was dispersed in an organic vehicle (ethyl cellulose resin: 20 percent by weight, ethyl isobutyl ketone: 80 percent by weight) by a three-roll mill to prepare an electroconductive paste. The compounding ratio of the Ni powder to the organic vehicle was 70 percent by weight to 30 percent by weight.

Then, the electroconductive paste was applied onto one of the ceramic green sheets by screen printing to form an electroconductive pattern having a predetermined shape including a circular portion in substantially the center of the surface of the ceramic green sheet.

The ceramic green sheet having the electroconductive pattern was disposed between a plurality of ceramic green sheets not having electroconductive patterns, and the stack of the ceramic green sheets was pressed to form a ceramic stack. The number of the stacked ceramic green sheets was 12, including the ceramic green sheet having the electroconductive pattern.

Then, the resulting ceramic stack was debindered at 300° C. for 5 hours in a $N_2$ atmosphere, and subsequently fired at 1100° C. for 2 hours in an atmosphere of $N_2$—$H_2$ ($H_2/N_2=3/1000$) to co-sinter the ceramic green sheets intended for the piezoelectric ceramic body and the electroconductive pattern intended for the internal electrode. Thus, a piezoelectric ceramic body containing the internal electrode was completed.

Then, the piezoelectric ceramic body was subjected to sputtering using Ag as the target to form electroconductive layers for polarization on the front and rear surfaces of the piezoelectric ceramic body. Then, polarization was performed by applying a direct current electric field of 3 kV/mm in the thickness direction in silicone oil of 100° C.

Then, the electroconductive layers were removed by etching using a nitric acid solution. Subsequently, regions other than the portions intended for the external electrodes were masked and the piezoelectric ceramic body was subjected to sputtering again using Ag as the target. Ag external electrodes were thus formed on the front and rear surfaces of the piezoelectric ceramic body. Thus, a test piece of Example 1 was completed.

The test piece of Example 1 had an external dimension of about 8 mm in length, about 8 mm in width, and about 0.4 mm in thickness. The circular portions of the internal electrode and the external electrodes had a diameter of about 1.5 mm.

Example 2

A test piece of Example 2 was prepared in the same manner and the same procedure as in Example 1 except that $K_2CO_3$, $Na_2CO_3$, $Li_2CO_3$, and $Nb_2O_5$ were prepared as ceramic raw materials and were weighed out so as to prepare a piezoelectric ceramic composition whose main constituent was expressed by a compositional formula $(K_{0.475}Na_{0.475}Li_{0.05})NbO_3$. The firing was performed at 1050° C. for 2 hours.

Example 3

A test piece of Example 3 was prepared in the same manner and the same procedure as in Example 1 except that $K_2CO_3$, $Na_2CO_3$, $Li_1CO_3$, $Nb_2O_5$, and $Ta_2O_5$ were prepared as ceramic raw materials and were weighed out so as to prepare a piezoelectric ceramic composition whose main constituent was expressed by a compositional formula $(K_{0.5}Na_{0.5})(Nb_{0.9}Ta_{0.1})O_3$. The firing was performed at 1050° C. for 2 hours.

Comparative Examples 1 to 3

An electroconductive paste was prepared by dispersing Pt powder having an average particle size of 1.5 μm in the same organic vehicle as in Example 1 using a three-roll mill.

The electroconductive paste was applied onto the ceramic green sheets formed in Examples 1 to 3 each by screen printing to form an electroconductive pattern having a predetermined shape. The ceramic green sheet having the electroconductive pattern was disposed between a plurality of ceramic green sheets not having electroconductive patterns, and the stack of the ceramic green sheets was pressed to form a ceramic stack.

Then, the ceramic stack was debindered at 350° C. for 2 hours in a normal atmosphere, and was subsequently fired at a temperature of 1050 to 1200° C. for 1 to 10 hours in a normal atmosphere. Thus, a piezoelectric ceramic body containing the internal electrode was prepared. The subsequent manner and procedure were the same as in Example 1 and thus test pieces of Comparative Examples 1 to 3 were completed.

Comparative Example 4

$Pb_3O_4$, $TiO_2$, and $ZrO_2$ were prepared as ceramic raw materials and were weighed out so as to prepare a piezoelectric ceramic composition whose main constituent was expressed by a compositional formula $Pb(Ti_{0.48}Zr_{0.52})O_2$.

The weighed materials and water were placed in a ball mill containing PSZ and was wet-mixed for about 4 hours. After being dried, the mixture was calcined at a temperature of 800° C. to yield a calcined material.

Then, 100 parts by weight of the calcined material, 0.5 part by weight of $Nb_2O_5$, and water were placed in a ball mill containing PSZ and wet-mixed for about 4 hours to prepare a mixture.

The, 100 parts by weight of the resulting calcined material, 10 parts by weight of vinyl acetate resin, and 100 parts by weight of water were placed in a ball mill containing PZT, and an appropriate amount of plasticizer was further added. The materials were wet-mixed for 4 hours and thus a ceramic slurry was prepared.

Then, a ceramic stack was made out of the ceramic slurry in the same manner and the same procedure as in Example 1. The ceramic stack was debindered at 280° C. for 5 hours in a $N_2$ atmosphere and was subsequently fired at 1200° C. for 2 hours in a $N_2$—$H_2$ reducing atmosphere as in Example 1. Thus, a piezoelectric ceramic body containing a Ni internal electrode was prepared.

The piezoelectric ceramic body was subjected to sputtering using Ag as the target to form electroconductive layers on the front and rear surfaces of the piezoelectric ceramic body, as in Example 1. Then, polarization was performed by applying a direct current electric field of 3 kV/mm in the thickness direction in silicone oil of 60° C.

The subsequent manner and procedure were the same as in Example 1 and thus a test piece of Comparative Example 4 was completed.

Comparative Example 5

The electroconductive paste mainly containing Pt prepared in Comparative Examples 1 to 3 was applied onto one of the ceramic green sheets prepared in Comparative Example 4 by screen printing to form an electroconductive pattern. The ceramic green sheet having the electroconductive pattern was disposed between a plurality of ceramic green sheets not having electroconductive patterns, and the stack of the ceramic green sheets was pressed to form a ceramic stack.

The resulting ceramic stack was treated to remove the binder at 350° C. for 2 hours in a normal atmosphere, and subsequently fired at 1200° C. for 2 hours in a normal atmosphere. Thus a piezoelectric ceramic body containing a Pt internal electrode was prepared.

The subsequent manner and procedure were the same as in Example 1, and thus a test piece of Comparative Example was completed.

Comparative Example 6

Ceramic raw materials $Pb_3O_4$, $CaCO_3$, $TiO_2$, and $ZrO_2$ were prepared and weighed out so as to prepare a piezoelectric ceramic composition whose main constituent was expressed by a compositional formula $(Pb_{0.8}Ca_{0.2})(Ti_{0.48}Zr_{0.52})O_3$.

The subsequent manner and procedure were the same as in Comparative Example 4 and thus a test piece of Comparative Example 6 using Ni as the internal electrode material was completed.

Comparative Example 7

Ceramic raw materials $Pb_3O_4$, $CaCO_3$, $TiO_2$, and $ZrO_2$ were prepared and weighed out so as to prepare a piezoelectric ceramic composition whose main constitute was expressed by a compositional formula $(Pb_{0.92}Ca_{0.1})(Ti_{0.48}Zr_{0.52})O_3$.

The subsequent manner and procedure were the same as in Comparative Example 4 and thus a test piece of Comparative Example 7 using Ni as the internal electrode material was completed.

[Evaluation of Piezoelectric Characteristics]

An impedance analyzer (HP4291A, manufactured by Hewlett Packard) was connected between the external electrodes of the front and rear surfaces of the test piece and its internal electrode and the electromechanical coupling coefficient k was measured to evaluate the piezoelectric property piezoelectrically vibrating the test piece.

Table 1 shows the constituents of the piezoelectric ceramic composition (piezoelectric ceramic body), the atmosphere for firing the ceramic stack, and the electromechanical coupling coefficient k in each of Examples 1 to 3 and Comparative Examples 1 to 7.

TABLE 1

| | | Piezoelectric ceramic composition | | | |
|---|---|---|---|---|---|
| | | Main constituent | Added constituent (part by weight) | Firing atmosphere | Electromechanical coupling coefficient k (%) |
| Example | 1 | $(K_{0.5}Na_{0.5})NbO_3$ | — | Reducing atmosphere | 32.8 |
| | 2 | $(K_{0.475}Na_{0.475}Li_{0.05})NbO_3$ | — | Reducing atmosphere | 36.2 |
| | 3 | $(K_{0.5}Na_{0.5})(Nb_{0.9}Ta_{0.1})O_3$ | — | Reducing atmosphere | 39.5 |

TABLE 1-continued

| | | Piezoelectric ceramic composition | | |
|---|---|---|---|---|
| | | Main constituent | Added constituent (part by weight) | Firing atmosphere | Electromechanical coupling coefficient k (%) |
| Comparative Example | 1 | $(K_{0.5}Na_{0.5})NbO_3$ | — | Normal atmosphere | 36.4 |
| | 2 | $(K_{0.475}Na_{0.475}Li_{0.05})NbO_3$ | — | Normal atmosphere | 40.5 |
| | 3 | $(K_{0.5}Na_{0.5})(Nb_{0.9}Ta_{0.1})O_3$ | — | Normal atmosphere | 42.3 |
| | 4 | $Pb(Ti_{0.48}Zr_{0.52})O_3$ | $Nb_2O_5$ (0.5) | Reducing atmosphere | Not polarized |
| | 5 | $Pb(Ti_{0.48}Zr_{0.52})O_3$ | $Nb_2O_5$ (0.5) | Normal atmosphere | 55.0 |
| | 6 | $(Pb_{0.8}Ca_{0.2})(Ti_{0.48}Zr_{0.52})O_3$ | $Nb_2O_5$ (0.5) | Reducing atmosphere | Not polarized |
| | 7 | $(Pb_{0.92}Ca_{0.1})(Ti_{0.48}Zr_{0.52})O_3$ | $Nb_2O_5$ (0.5) | Reducing atmosphere | Not polarized |

Comparative Examples 1 to 3 each used an alkali metal niobate-based compound for the piezoelectric ceramic composition and a noble metal Pt for the internal electrode, and the firing was performed in a normal atmosphere. On the other hand, Examples 1 to 3 each used an alkali metal niobate-based compound for the piezoelectric ceramic composition, as in Comparative Examples 1 to 3, and a base metal Ni for the internal electrode, and the firing was performed in a reducing atmosphere. In comparison between Examples and Comparative Examples, the electromechanical coupling coefficients k of Comparative Examples 1 to 3 were in the range of 36.4% to 42.3%, while the electromechanical coupling coefficients k of Examples 1 to 3 were in the range of 32.8% to 39.5%. Although the electromechanical coupling coefficients k of Examples 1 to 3 are slightly inferior to those of Comparative Examples 1 to 3, the difference in electromechanical coupling coefficient between the Examples and the Comparative Examples is small. This suggests that the Examples can produce monolithic piezoelectric elements having such piezoelectric properties as the elements can be properly used in practice.

In Comparative Example 4, the piezoelectric ceramic composition mainly contains a known PZT compound and 0.5 part by weight of $Nb_2O_5$ is added to 100 parts by weight of the main constituent. However, the piezoelectric ceramic body was turned into a semiconductor and consequently was not able to be polarized.

In Comparative Example 5, the piezoelectric ceramic composition was the same as in Comparative Example 4, but the firing was performed in a normal atmosphere. Therefore, the piezoelectric ceramic composition did not turn into a semiconductor and exhibited a favorable electromechanical coupling coefficient k of 55.0%. However, the internal electrode was made of expensive Pt, and thus cost reduction, which is one of the objects of the invention, was not able to be accomplished.

In comparative Examples 6 and 7, Part of Pb of the A site is replaced with ca, but the piezoelectric ceramic composition was turned into a semiconductor and was not able to be polarized because it was fired in a reducing atmosphere. Thus the resulting piezoelectric element did not function even though the internal electrode was made of Ni.

As is clear from the Examples, a piezoelectric ceramic composition containing a PZT compound may become difficult to polarize if it is fired in a reducing atmosphere. On the other hand, a piezoelectric ceramic composition containing an alkali metal niobate-based compound can exhibit such an electromechanical coupling coefficient k as it can be properly used in practice though the electromechanical coupling coefficient k is slightly reduced in comparison with the case where the firing is performed in a normal atmosphere. In this instance, inexpensive Ni being a base metal can be used for the internal electrode, and thus inexpensive and practical piezoelectric element can easily be achieved.

The invention claimed is:

1. A method for manufacturing a piezoelectric element, the method comprising:
   preparing a piezoelectric ceramic material containing a perovskite complex oxide having an alkali metal niobate-based compound as a main component;
   forming the piezoelectric ceramic material into compacts having a predetermined shape;
   applying an electroconductive paste to form an internal electrode onto the compacts, the internal electrode comprising a base metal material that contains Ni as a main component;
   stacking the compacts onto which the electroconductive paste has been applied to form a multilayer structure; and
   co-sintering the multilayer structure in a non-oxidizing atmosphere.

2. The method for manufacturing a piezoelectric element according to claim 1, wherein the multilayer structure is co-sintered at a temperature of 1000° C. to 1400° C.

3. The method for manufacturing a piezoelectric element according to claim 1, wherein the piezoelectric ceramic material is formed into green sheets.

4. The method for manufacturing a piezoelectric element according to claim 1, wherein the co-sintered multilayer structure is polarized in a thickness direction.

* * * * *